(12) United States Patent  
Yamamoto et al.

(10) Patent No.: US 12,132,472 B2  
(45) Date of Patent: Oct. 29, 2024

(54) DRIVE CONTROL DEVICE FOR POWER SEMICONDUCTOR ELEMENT, AND POWER MODULE

(71) Applicant: Mitsubishi Electric Corporation, Tokyo (JP)

(72) Inventors: Shotaro Yamamoto, Tokyo (JP); Kenichi Morokuma, Tokyo (JP); Yoshiko Tamada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/921,367

(22) PCT Filed: Jun. 1, 2020

(86) PCT No.: PCT/JP2020/021507  
§ 371 (c)(1),  
(2) Date: Oct. 26, 2022

(87) PCT Pub. No.: WO2021/245719  
PCT Pub. Date: Dec. 9, 2021

(65) Prior Publication Data  
US 2023/0179196 A1 Jun. 8, 2023

(51) Int. Cl.  
*H03K 17/082* (2006.01)  
*H03K 3/012* (2006.01)  
*H03K 17/08* (2006.01)

(52) U.S. Cl.  
CPC ......... *H03K 17/0822* (2013.01); *H03K 3/012* (2013.01); *H03K 2017/0806* (2013.01)

(58) Field of Classification Search  
CPC ............... H03K 17/0822; H03K 3/012; H03K 2017/0806  
See application file for complete search history.

(56) References Cited

U.S. PATENT DOCUMENTS

| 8,985,850 B1* | 3/2015 | Godbole | ................ G01K 7/01 374/178 |
| 2009/0021294 A1* | 1/2009 | Morishita | .......... H03K 17/0828 327/434 |

(Continued)

FOREIGN PATENT DOCUMENTS

| JP | 2010-283973 A | 12/2010 |
| JP | 2018-93684 A | 6/2018 |

OTHER PUBLICATIONS

International Search Report and Written Opinion mailed on Aug. 18, 2020, received for PCT Application PCT/JP2020/021507, filed on Jun. 1, 2020, 8 pages including English Translation.

*Primary Examiner* — Ryan Johnson  
*Assistant Examiner* — Colleen J O Toole  
(74) *Attorney, Agent, or Firm* — XSENSUS LLP

(57) ABSTRACT

A classification circuit generates first information for classifying an operating state of a power semiconductor element into one of a plurality of predetermined operating regions. A selector circuit generates second information for selecting a plurality of modes with different switching speeds, based on a user input. A characteristic control circuit stores a drive adjustment signal in advance for each of combinations of the operating regions and the modes and outputs the drive adjustment signal in a combination of one operating region and one mode that is selected in accordance with the first information and the second information. A gate drive circuit charges/discharges a gate at a charge rate and a discharge rate variably set in accordance with the drive adjustment signal from the characteristic control circuit, at the time of on/off of the power semiconductor element.

7 Claims, 11 Drawing Sheets

(56) References Cited

U.S. PATENT DOCUMENTS

2018/0159521 A1    6/2018   Tsurumaru
2020/0089183 A1*   3/2020   Kallikuppa .......... G05B 19/058

* cited by examiner

| | | CURRENT CLASSIFICATION | | | |
|---|---|---|---|---|---|
| | | A | B | C | ... |
| TEMPERATURE CLASSIFICATION | 1 | A1 | B1 | C1 | ... |
| | 2 | A2 | B2 | C2 | ... |
| | 3 | A3 | B3 | C3 | ... |
| | ⋮ | ⋮ | ⋮ | ⋮ | ... |

DRIVE CONTROL DEVICE FOR POWER SEMICONDUCTOR ELEMENT, AND POWER MODULE

CROSS-REFERENCE TO RELATED APPLICATION

The present application is based on PCT filing PCT/JP2020/021507, filed Jun. 1, 2020, the entire content of which is incorporated herein by its reference.

TECHNICAL FIELD

The present disclosure relates to a drive control device for a power semiconductor element, and a power module.

BACKGROUND ART

A drive control device for charging/discharging the control electrode (gate) of a semiconductor element in accordance with on/off control signals is employed for switching operation of a voltage-driven semiconductor element such as a metal-oxide-semiconductor field-effect transistor (MOSFET) and an insulated gate bipolar transistor (IGBT).

In such switching operation, it is known that there is a trade-off between the magnitude of power loss (called switching loss) of the semiconductor element and the magnitude of surge. Specifically, while increasing the gate charge/discharge rate to reduce switching loss increases surge, decreasing the gate charge/discharge rate to reduce surge increases switching loss. A drive control device for a semiconductor element is required to appropriately adjust this trade-off.

For example, Japanese Patent Laying-Open No. 2010-283973 (PTL 1) discloses a drive device for a power semiconductor element whose switching is controlled, in which a plurality of switching elements are connected in parallel on each of a charge path and a discharge path for the gate of the power semiconductor element, and the gate charge/discharge rate is adjusted by the number of turned-on switching elements.

In particular, in PTL 1, the number of turned-on switching elements on the charge path and the discharge path is controlled by a switching pattern stored in an electrically erasable programmable read-only memory (EEPROM). It is also disclosed that this switching pattern is variably controlled depending on current or temperature of the power semiconductor element, or atmospheric pressure.

CITATION LIST

Patent Literature

PTL 1: Japanese Patent Laying-Open No. 2010-283973

SUMMARY OF INVENTION

Technical Problem

However, when the application of a power semiconductor element, specifically, the configuration of a power converter equipped with the power semiconductor element varies, switching loss or surge level permitted in the power semiconductor element may vary depending on the circuit configuration or the electrical specifications of the power converter.

In this respect, in PTL 1, when the current or temperature of the power semiconductor element or the like is the same, the gate charge/discharge rate, that is, gate driving capability is the same. Therefore, when the configuration or the electrical specifications of the application are changed, switching loss or surge may exceed the permitted value of the power semiconductor element. Conversely, when the gate driving capability does not match the configuration or the electrical specifications, and the performance of the power semiconductor element may fail to be sufficiently fulfilled.

On the other hand, adjusting the gate driving capability to the application as described above may impose excessive burden on users.

The present disclosure is made to solve the problem as described above and an object of the present disclosure is to provide a configuration that enables users to easily adjust the trade-off characteristic between switching loss and surge of a power semiconductor element whose switching is controlled.

Solution to Problem

According to an aspect of the present disclosure, a drive control device for a power semiconductor element switching-controlled includes a classification circuit, a characteristic control circuit, a selector circuit, and a gate drive circuit. The classification circuit generates first information for classifying an operating state of the power semiconductor element into one of a plurality of predetermined operating regions. The characteristic control circuit adjusts a charge rate of a control electrode of the power semiconductor element in turn-on operation of the power semiconductor element and a discharge rate of the control electrode in turn-off operation of the power semiconductor element. The selector circuit generates second information for selecting one mode of a plurality of modes with different switching speeds of the power semiconductor element, based on a user input. The characteristic control circuit stores a drive adjustment signal for setting the charge rate and the discharge rate, in advance, for each of combinations of the operating regions and the modes, and outputs the drive adjustment signal in the combination of one operating region among the operating regions and one mode among the modes that is selected in accordance with the first information and the second information. The gate drive circuit charges/discharges the control electrode at the charge rate and the discharge rate variably set in accordance with the drive adjustment signal from the characteristic control circuit, at a time of the turn-on operation and at a time of the turn-off operation.

According to another aspect of the present disclosure, a power module includes the drive control device described above and the power semiconductor element to be turned on/off by the drive control device.

Advantageous Effects of Invention

According to the present disclosure, the gate charge/discharge rate at the time of turn-on and at the time of turn-off can be adjusted by selectively reading a plurality of drive adjustment signals stored in advance in accordance with a combination of the operating state of the power semiconductor element and the mode selected based on the user input, so that the trade-off characteristic between switching loss and surge of the power semiconductor element can be easily adjusted by mode selection on the user side.

DESCRIPTION OF EMBODIMENTS

Figure 1:
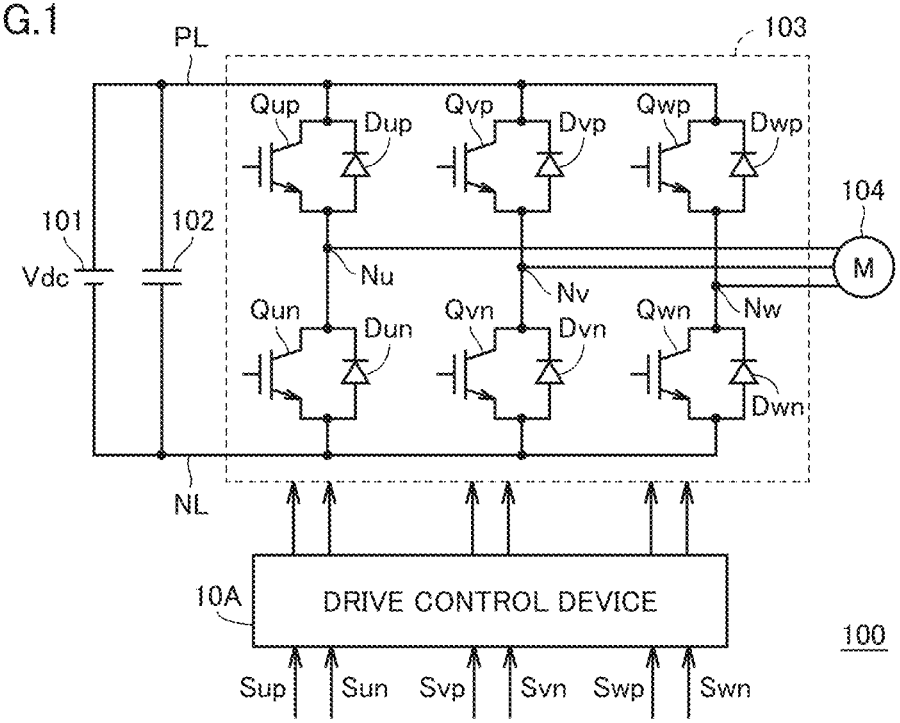
FIG. 1 is a schematic diagram illustrating a configuration of a power conversion system illustrated as an example of the application of a drive control device according to the present embodiment.

Embodiments of the present disclosure will be described in detail below with reference to the drawings. In the following, like or corresponding parts in the drawings are denoted by like reference signs and a description thereof is basically not repeated.

First Embodiment

FIG. 1 is a schematic diagram illustrating a configuration of a power conversion system illustrated as an example of the application of a drive control device according to the present embodiment.

Referring to FIG. 1, a power conversion system 100 includes a DC power source 101, a DC link capacitor 102, a three phase inverter 103, which is a typical example of a power converter, and a drive control device 10A.

DC power source 101 is a voltage source that outputs a certain DC voltage Vdc and can be composed of a power storage device such as a battery or a capacitor, an AC/DC converter for converting an AC voltage from a commercial power system to a DC voltage, or a combination thereof. The power storage device can be used to recover regenerative power.

DC link capacitor 102 is connected between a high voltage-side power line PL and a low voltage-side power line NL to connect the DC side of three phase inverter 103 and DC power source 101. DC link capacitor 102 removes an AC fluctuating component to smooth a DC-side voltage (Vdc) of three phase inverter 103.

Three phase inverter 103 includes three phase (U phase, V phase, and W phase) arms connected in parallel between power lines PL and NL. The U-phase arm includes power semiconductor elements Qup and Qun connected in series between power lines PL and NL through an AC node Nu.

Similarly, the V-phase arm includes power semiconductor elements Qvp and Qvn connected in series between power lines PL and NL through an AC node Nv. The W-phase arm includes power semiconductor elements Qwp and Qwn connected in series between power lines PL and NL through an AC node Nw.

Each of power semiconductor elements Qup, Qun, Qvp, Qvn, Qwp, and Qwn is composed of a power semiconductor element, such as a MOS-FET and an IGBT, whose switching is controlled in accordance with a voltage of the control electrode (gate). FIG. 1 illustrates a configuration example with IGBTs. Freewheeling diodes Dup, Dun, Dvp, Dvn, Dwp, and Dwn are connected in antiparallel with power semiconductor elements Qup, Qun, Qvp, Qvn, Qwp, and Qwn, respectively.

An AC motor 104 is connected to AC nodes Nu, Nv, and Nw corresponding to the AC side of three phase inverter 103. Three phase inverter 103 converts DC voltage Vdc from DC power source 101 into a three phase AC voltage to be applied to AC motor 104 by switching control of power semiconductor elements Qup, Qun, Qvp, Qvn, Qwp, and Qwn. AC motor 104 thus can be driven at a variable speed.

For example, power semiconductor elements Qup, Qun, Qvp, Qvn, Qwp, and Qwn are turned on/off by control signals Sup, Sun, Svp, Svn, Swp, and Swn in accordance with an output command of pulse width modulation (PWM) for converting a DC voltage into a three phase AC voltage.

Drive control device 10A controls the voltage at the control electrodes (gates) of power semiconductor elements Qup, Qun, Qvp, Qvn, Qwp, and Qwn in accordance with control signals Sup, Sun, Svp, Svn, Swp, and Swn. Thus, the switching of each of power semiconductor elements Qup, Qun, Qvp, Qvn, Qwp, Qwn is controlled.

In a power semiconductor element, main current flowing between a first main electrode and a second main electrode is controlled in accordance with a voltage at the control electrode (gate). When power semiconductor element Q is an IGBT, the first main electrode is "collector", the second main electrode is "emitter", and collector-emitter current (hereinafter simply denoted as collector current Ic) that is a main current is controlled in accordance with a gate voltage Vg. Hereinafter, power semiconductor elements Qup, Qun, Qvp, Qvn, Qwp, and Qwn may be collectively referred to simply as power semiconductor element Q. Similarly, control signals Sup, Sun, Svp, Svn, Swp, and Swn may be collectively referred to simply as control signal S.

In each power semiconductor element Q, in OFF state, while voltage between the first and second main electrodes (collector-emitter voltage Vce) is produced (Vce>0), Ic=0. On the other hand, in ON state, while Ic>0, collector-emitter saturated voltage Vcesat is extremely small, and therefore Vce is generally 0 (V) for DC voltage Vdc.

In turn-on operation in which power semiconductor element Q changes from OFF state to ON state, while Vce decreases toward 0 with increasing gate voltage Vg, Ic increases from 0. Conversely, in turn-off operation in which power semiconductor element Q changes from ON state to OFF state, while Ic decreases toward 0 with decreasing gate voltage Vg, Vce increases from 0.

In a transient period in which gate voltage Vg changes with turn-off operation and turn-on operation, there is a period in which both Vce and Ic are not 0, and in this period, power loss (switching loss) corresponding to the time integral value of IcVice occurs.

Furthermore, it is known that in addition to switching loss, surge current occurs in turn-on operation. Surge current occurs due to the reverse recovery characteristic of the freewheeling diode positioned at the opposed arm of each power semiconductor element Q. For example, surge current occurring at the time of turn-on of power semiconductor element Qup depends on the current change amount (dIc/dt) at the time of turn-on and the characteristics of freewheeling diode Dun connected in antiparallel with power semiconductor element Qun opposed to power semiconductor element Qup.

In turn-off operation, it is known that surge voltage occurs in addition to switching loss. The surge voltage occurs in accordance with the product of wiring inductance (parasitic inductance) of the power converter (three phase inverter 103) including power lines PL and NL and the current change amount (dIc/dt) at the time of turn-off.

The surge voltage and the surge current are suppressed by reducing the change rate of Vce and Ic in turn-off operation and turn-on operation, that is, by reducing the switching speed. On the other hand, when the switching speed is reduced, the time taken until Ic=0 at the time of turn-off and the time taken until Vce=0 at the time of turn-on become longer, thereby increasing switching loss. In this way, in each of turn-on operation and turn-off operation of the power semiconductor element, it is common that there is a trade-off between the switching loss and the surge component.

For example, when there is a margin in surge tolerance but the switching speed is low, the power conversion efficiency decreases with increase in switching loss. On the other hand, when the switching speed is too high in pursuit of power conversion efficiency, the arising surge exceeding the tolerance may incur destruction of the element.

In this respect, in the present embodiment, a configuration for appropriately adjusting the switching speed without excessively increasing the burden of adjustment by the user of the power semiconductor element will be described.

Figure 2:
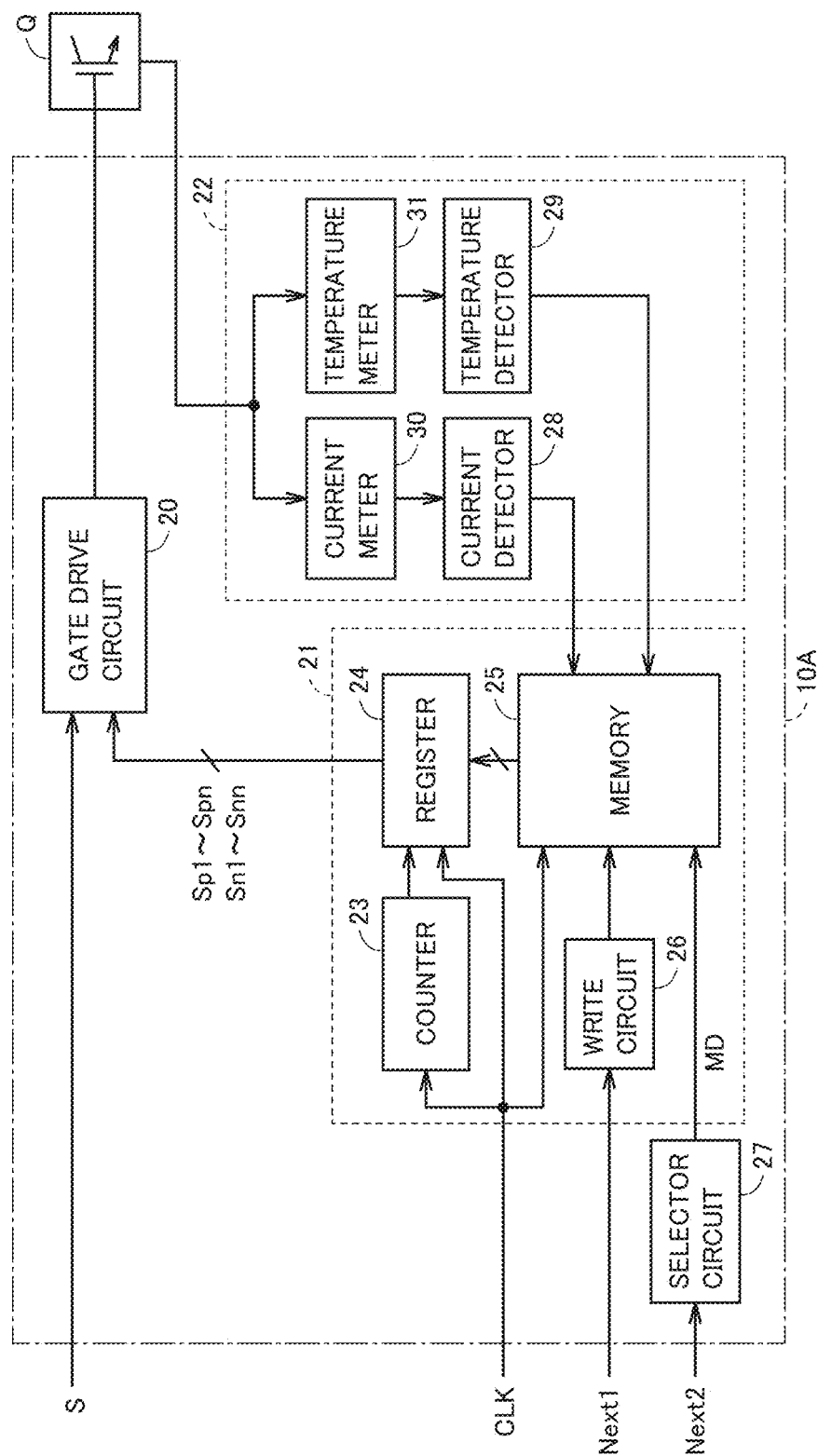
FIG. 2 is a block diagram illustrating a configuration example of a drive control device according to a first embodiment.

FIG. 2 is a block diagram illustrating a configuration example of a drive control device according to a first embodiment.

Referring to FIG. 2, drive control device 10A according to the first embodiment includes a gate drive circuit 20, a characteristic control circuit 21, a classification circuit 22, and a selector circuit 27. FIG. 2 illustrates a configuration corresponding to one power semiconductor element Q.

Gate drive circuit 20 turns on/off the corresponding power semiconductor element Q, that is, controls switching in accordance with control signal S, at a switching speed variably set by drive adjustment signals Sp1 to Spn, Sn1 to Snn output from characteristic control circuit 21.

Each of control signal S and drive adjustment signals Sp1 to Spn, Sn1 to Snn is a binary signal set to one of "1 (logic high level)" and "0 (logic low level)". It is assumed that in ON period of power semiconductor element Q, control signal S is set to "1", and in OFF period of power semiconductor element Q, control signal S is set to "0".

Figures 3, 4:
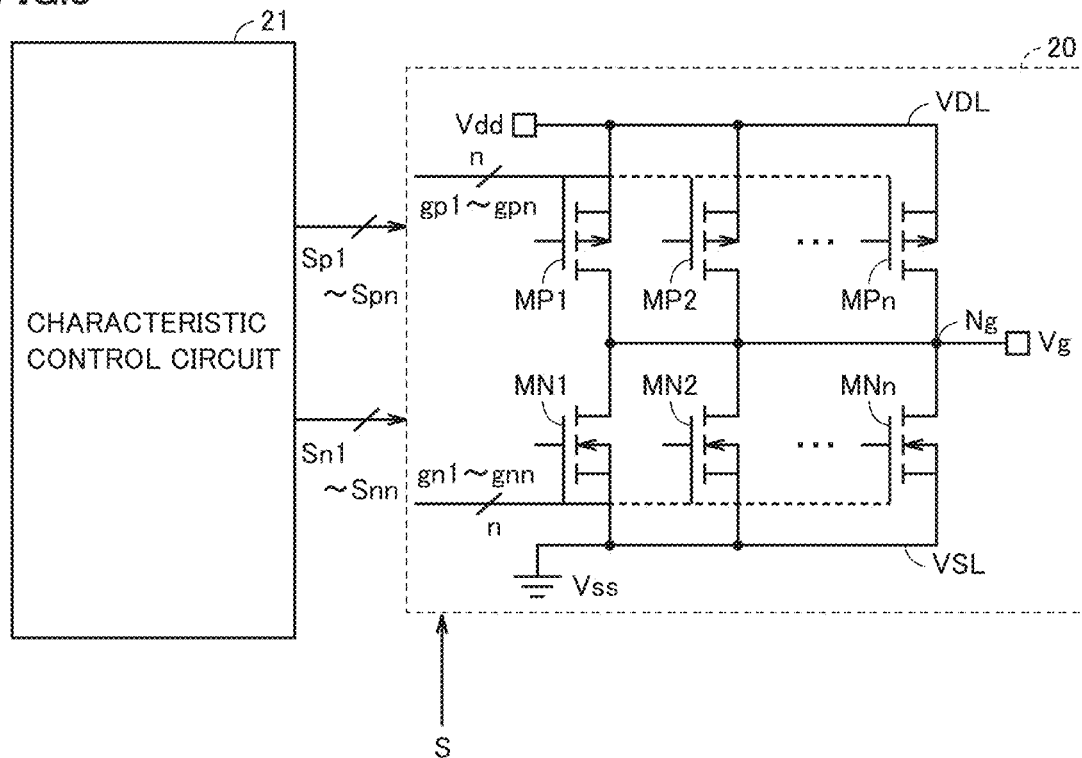
FIG. 3 is a circuit diagram illustrating an exemplary configuration of a gate drive circuit illustrated in FIG. 2.
FIG. 4 is a conceptual diagram illustrating classification of operating states of a power semiconductor element.

FIG. 3 is a circuit diagram illustrating an exemplary configuration of the gate drive circuit illustrated in FIG. 2.

Referring to FIG. 3, gate drive circuit 20 includes n (n is a natural number equal to or greater than 2) P-type MOS-FETs (hereinafter referred to as PMOS transistors) MP1 to MPn connected in parallel between a first power supply line VDL and a node Ng and n N-type MOS-FETs (hereinafter referred to as NMOS transistors) NP1 to NPn connected between a second power supply line VSL and node Ng. Node Ng is electrically connected to the gate of power semiconductor element Q.

Second power supply line VSL transmits a power supply voltage Vss for turning off power semiconductor element Q. Power supply voltage Vss is set to the same voltage as the emitter voltage of power semiconductor element Q. First power supply line VDL transmits a power supply voltage Vdd for turning on power semiconductor element Q. For example, for IGBTs, Vdd=15 [V] can be set.

The voltage difference at node Ng with respect to power supply voltage Vss is denoted as gate voltage Vg. When gate voltage Vg is higher than a threshold voltage (Vt) of power semiconductor element Q, power semiconductor element Q is brought into ON state.

Control signals gp1 to gpn are input to the gates of PMOS transistors MP1 to MPn, respectively. When each of control signals gp1 to gpn is "0", each of PMOS transistors MP1 to MPn is turned on, and charge current is supplied with power supply voltage Vdd to a node Nd (that is, the gate of power semiconductor element Q).

Control signals gp1 to gpn of PMOS transistors MP1 to MPn are set in accordance with control signal S of power semiconductor element Q and drive adjustment signals Sp1 to Spn from characteristic control circuit 21. When control signal S is "0", all of control signals gp1 to gpn are set to "1" and all of PMOS transistors MP1 to MPn are turned off. A charge path through node Ng is therefore not formed.

In comparison, when control signal S is "1", control signals gp1 to gpn are set to "1" or "0" in accordance with drive adjustment signals Sp1 to Spn. Specifically, when drive adjustment signals Sp1 to Spn are "1", control signals gp1 to gpn are set to "0", and when drive adjustment signals Sp1 to Spn are "0", control signals gp1 to gpn are set to "1".

As a result, at the time of turn-on operation in which control signal S changes from "0" to "1", the number of turned-on PMOS transistors MP1 to MPn changes with drive adjustment signals Sp1 to Spn. In other words, charge current at node Ng at the time of turn-on operation, that is, the gate charge driving capability is adjusted by drive adjustment signals Sp1 to Spn. For example, control signals gp1 to gpn can be set by NAND (NOT AND) operation of control signal S and control signals gp1 to gpn. It is understood that the larger the charge current and the higher the charge driving capability, the higher the gate charge rate.

When a high gate charge rate is set by drive adjustment signals Sp1 to Spn, the switching loss at the time of turn-on of power semiconductor element Q decreases, and instead the surge increases. On the other hand, when a low gate charge rate is set, the switching loss at the time of turn-off of power semiconductor element Q increases, and instead the surge decreases.

Similarly, control signals gn1 to gnn of NMOS transistors MN1 to MNn are set in accordance with control signal S and drive adjustment signals Sn1 to Snn from characteristic control circuit 21. When control signal S is "1", all of control signals gn1 to gnn are set to "0" and all of NMOS transistors MN1 to MNn are turned off. A discharge path through node Ng is therefore not formed.

In comparison, when control signal S is "0", control signals gn1 to gnn are set to "1" or "0" in accordance with drive adjustment signals Sn1 to Snn. Specifically, when drive adjustment signals Sn1 to Snn are "1", control signals gn1 to gnn are set to "1", and when drive adjustment signals Sn1 to Snn are "0", control signals gn1 to gnn are set to "0".

As a result, at the time of turn-off operation in which control signal S changes from "1" to "0", the number of turned-on NMOS transistors MN1 to MNn changes with drive adjustment signals Sn1 to Snn. In other words, discharge current at node Ng at the time of turn-off operation, that is, the gate discharge driving capability is adjusted by drive adjustment signals Sn1 to Snn. For example, control signals gp1 to gpn can be set by AND operation of an inversion signal (/S) of control signal S and control signals gp1 to gpn. It is understood that the larger the discharge current and the higher the discharge driving capability, the higher the gate discharge rate.

When the gate discharge rate is increased by drive adjustment signals Sn1 to Snn, the switching loss at the time of turn-off of power semiconductor element Q decreases, and instead the surge increases. On the other hand, when the gate discharge rate decreases, the switching loss at the time of turn-off of power semiconductor element Q increases, and instead the surge decreases.

Increasing the number (N) of PMOS transistors and NMOS transistors enables fine tuning of charge rate and discharge rate but incurs cost increase. The number N therefore is designed to a proper value, considering the user's adjustment need and cost. Alternatively, the transistor size (current driving capability) of PMOS transistors and NMOS transistors is set stepwise in accordance with the factorial of 2, whereby the charge rate and the discharge rate can be set in $2^n$ steps using n PMOS transistors or NMOS transistors.

Referring to FIG. 2 again, the setting of drive adjustment signals Sp1 to Spn, Sn1 to Snn will be described in detail.

Characteristic control circuit 21 includes a counter 23, a register 24, a memory 25, and a write circuit 26. Counter 23, register 24, and memory 25 operate in synchronization with a clock signal CLK input to drive control device 10A from the outside. Each of counter 23 and register 24 is composed of a not-illustrated flip-flop or latch.

Write circuit 26 has a function of writing drive adjustment signals Sp1 to Spn, Sn1 to Snn into memory 25 with an external input INext1 to drive control device 10A.

Selector circuit 27 generates a mode command value MD for designating one of a plurality of modes of different switching speeds, in accordance with an external input INext2 to drive control device 10A. Mode command value MD is input to memory 25.

Classification circuit 22 includes a current detector 28, a temperature detector 29, a current meter 30, and a temperature meter 31.

Current meter 30 measures main current (collector current Ic) flowing in ON state of power semiconductor element Q. Current meter 30 can be composed of, for example, a Hall element-type current sensor or a shunt resistor attached to the collector terminal of power semiconductor element Q (IGBT). The measurement value by current meter 30 is input to current detector 28.

Current detector 28 detects which of (M+1) stratified current regions element current Iq in the current operating state of power semiconductor element Q belongs to, by comparison between element current Iq determined from the measurement value by current meter 30 and M boundary values (M: natural number) preset by the user.

For example, element current Iq can be determined using collector current Ic in ON period of power semiconductor element Q, excluding the turn-on period in which collector current Ic of power semiconductor element Q changes transiently. More specifically, current detector 28 is constructed to include a low-pass filter for removing a transient change, and element current Iq can be determined based on collector current Ic after passing through the low-pass filter in ON period.

Alternatively, current meter 30 is arranged so as to measure load current serving as output of three phase inverter 103, and element current Iq can be determined by the measured load current output to current detector 28.

Temperature meter 31 is arranged in the vicinity of power semiconductor element Q or on the same chip to measure the temperature at the arrangement location, thereby measuring the temperature of power semiconductor element Q (hereinafter also referred to as element temperature Tq). Temperature meter 31 is composed of, for example, a thermistor, a temperature sensing diode, or a thermocouple element. The measurement value by temperature meter 31 is input to temperature detector 29.

Temperature detector 29 detects which of (L+1) stratified temperature regions element temperature Tq in the current operating state of power semiconductor element Q belongs to, by comparison between the measurement value by temperature meter 31 and L boundary values (L: natural number) preset by the user.

FIG. 4 is a conceptual diagram illustrating classification of operating states of the power semiconductor element.

Referring to FIG. 4, element temperature Tq of power semiconductor element Q is classified into any one of (L+1) temperature regions by comparison with L boundary values described above. Similarly, element current Iq of power semiconductor element Q is classified into any one of (M+1) current regions by comparison with M boundary values described above. It is understood that the operating state of power semiconductor element Q is classified into (M+1)×(L+1) regions according to a combination of a classification of element temperature Tq and a classification of element current Iq.

In the present embodiment, L=M=2, and element temperature Tq is classified into three levels of 1 to 3, and element current Iq is classified into three levels of A to C. As a result, the classification includes three regions. As a result, the operating state of power semiconductor element Q is classified into 3×3=9 regions (operating regions), namely, A1 to A3, B1 to B3, and C1 to C3.

In this way, classification circuit 22 in FIG. 2 classifies the operating state at present of power semiconductor element Q according to element current Iq and element temperature Tq and selects any one of (M+1)×(L+1) operating regions defined in advance.

In general, in power semiconductor elements such as IGBTs, the switching characteristics tend to change depending on main current and temperature. Specifically, the switching loss at the time of on/off tends to increase as the main current increases and the junction temperature rises at high temperatures. It follows that when main current or temperature of the power semiconductor element changes, the relation between switching loss and surge also changes.

It is therefore preferable that the user side of the power conversion system equipped with the power semiconductor element can adjust the relation between switching loss and surge (that is, trade-off characteristic) in accordance with the classification of the operating state defined by a combination of temperature and current.

Referring to FIG. 2 again, a specific operation example of drive control device 10A will be described.

With external input INext1 input to drive control device 10A from the outside, drive adjustment signal data on the switching speed of power semiconductor element Q is written into memory 25.

Figure 5:
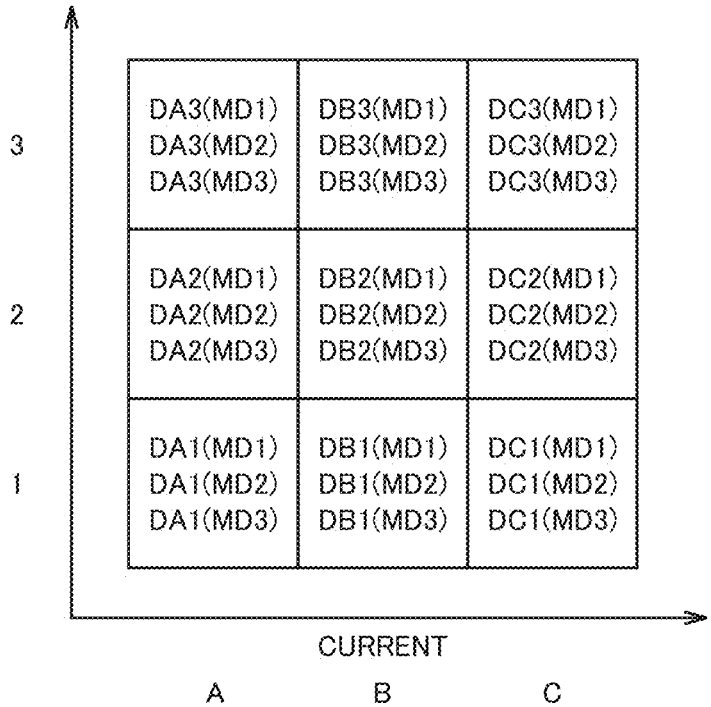
FIG. 5 is a conceptual diagram for explaining a manner of drive adjustment signal data held in a memory illustrated in FIG. 2.

FIG. 5 is a conceptual diagram for explaining a manner of the drive adjustment signal data held in the memory.

Referring to FIG. 5, in each of operating regions A1 to A3, B1 to B3, C1 to C3 of power semiconductor element Q represented by a combination of a classification (A to C) of element current Iq and a classification (1 to 3) of element temperature Tq, drive adjustment signal data formed of drive adjustment signals Sp1 to Spn (for charge rate adjustment) and Sn1 to Snn (for discharge rate adjustment) is held, as many as the number of modes selectable by users.

Figure 6:
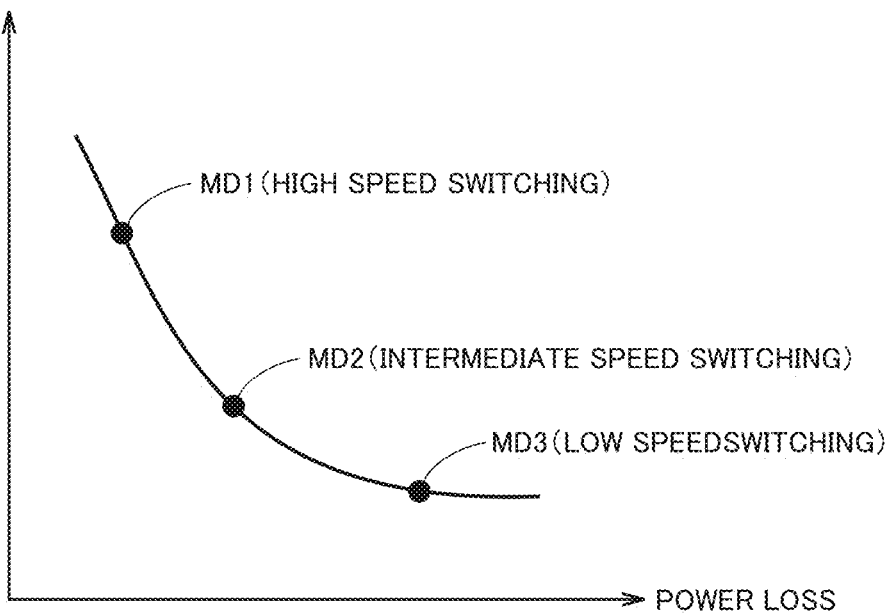
FIG. 6 is a conceptual diagram illustrating mode selection of switching speeds.

FIG. 6 is a conceptual diagram illustrating mode selection of switching speeds. Referring to FIG. 6, in the present embodiment, the user can select a switching speed mode from a high speed mode (MD1), an intermediate speed mode (MD2), and a low speed mode (MD3).

As described above, as the switching speed increases, the power loss is reduced while the surge increases. Conversely, as the switching speed decreases, the surge is reduced while the power loss increases. In order to decrease the switching speed, it is necessary to reduce gate charge current (that is, charge driving capability) at the time of turn-on operation and gate discharge current (that is, discharge driving capability) at the time of turn-off to decrease the gate charge/discharge rate.

The user can select modes MD1 to MD3 to be matched with the application of the power semiconductor element. For example, when the power semiconductor element is mounted on a system with small parasitic inductance, there is a margin in surge and therefore the high speed mode (MD1) can be selected in favor of reduction of switching loss. Conversely, in the application with a small margin of surge, the low speed mode (MD3) can be selected in favor of surge reduction. Alternatively, the intermediate speed mode (MD2) can be selected such that they are balanced.

In the present embodiment, the switching speed is selected from three modes MD1 to MD3. However, the number of selectable modes may be any natural number equal to or greater than 2.

Referring to FIG. 5 again, for example, in an operating region A1 with the lowest temperature and small current, drive adjustment signal data DA1 (MD1) to DA1(MD3) respectively corresponding to modes MD1 to MD3 are held. Each of drive adjustment signal data DA1(MD1) to DA1 (MD3) includes a set of drive adjustment signals Sp1 to Spn, Sn1 to Snn.

In order to increase the switching speed, it is necessary to increase the gate charge driving capability (discharge current) at the time of turn-on operation and the gate discharge driving capability (discharge current) at the time of turn-off to increase the gate charge/discharge rate. For this, in DA1(MD1) compared with DA1(MD2) and DA1(MD3), drive adjustment signals Sp1 to Spn are set such that the number of turned-on PMOS transistors MP1 to MPn (FIG. 2) is increased, and drive adjustment signals Sn1 to Snn are set such that the number of turned-on NMOS transistors MN1 to MNn (FIG. 2) is increased.

Conversely, in DA1(MD3) for the low speed mode, compared with DA1(MD1) and DA1(MD2), drive adjustment signals Sp1 to Spn, Sn1 to Snn are set such that the number of turned-on PMOS transistors MP1 to MPn and NMOS transistors MN1 to MNn (FIG. 2) is reduced, in order to decrease the gate charge/discharge rate.

In this way, drive adjustment signal data varying among modes MD1 to MD3 is held for each operating region of power semiconductor element Q in memory 25. In the example in FIG. 5, the number of selectable modes is three and three sets of drive adjustment signals are held in each of nine operating regions, so that, in total, 9×3=27 pieces of drive adjustment signal data are stored.

A current classification (A to C), a temperature classification (1 to 3), and mode selection (MD1 to MD3) are specified, whereby one piece of drive adjustment signal data can be read among multiple pieces (for example, 27 pieces) of drive adjustment signal data held in advance, from memory 25.

Using external input INext1 described above, the manufacturer of drive control device 10A, three phase inverter (power converter) 103, or power conversion system 100 may write the drive adjustment signal data in FIG. 5 in advance at the time of factory shipment or installation work. Furthermore, the user of power conversion system 100 may overwrite any drive adjustment signal data using external input INext1. In this case, the drive adjustment signal data can be overwritten with selection of a current classification (A to C), a temperature classification (1 to 3), and a mode selection (MD1 to MD3).

Referring to FIG. 2 again, the user can input a switching speed mode selection instruction, using external input INext2. In response to external input INext2, selector circuit 27 generates mode command value MD indicating which of modes MD1 to MD3 is selected. In the first embodiment, mode command value MD is fixed during operation of power semiconductor element Q.

Figure 7:
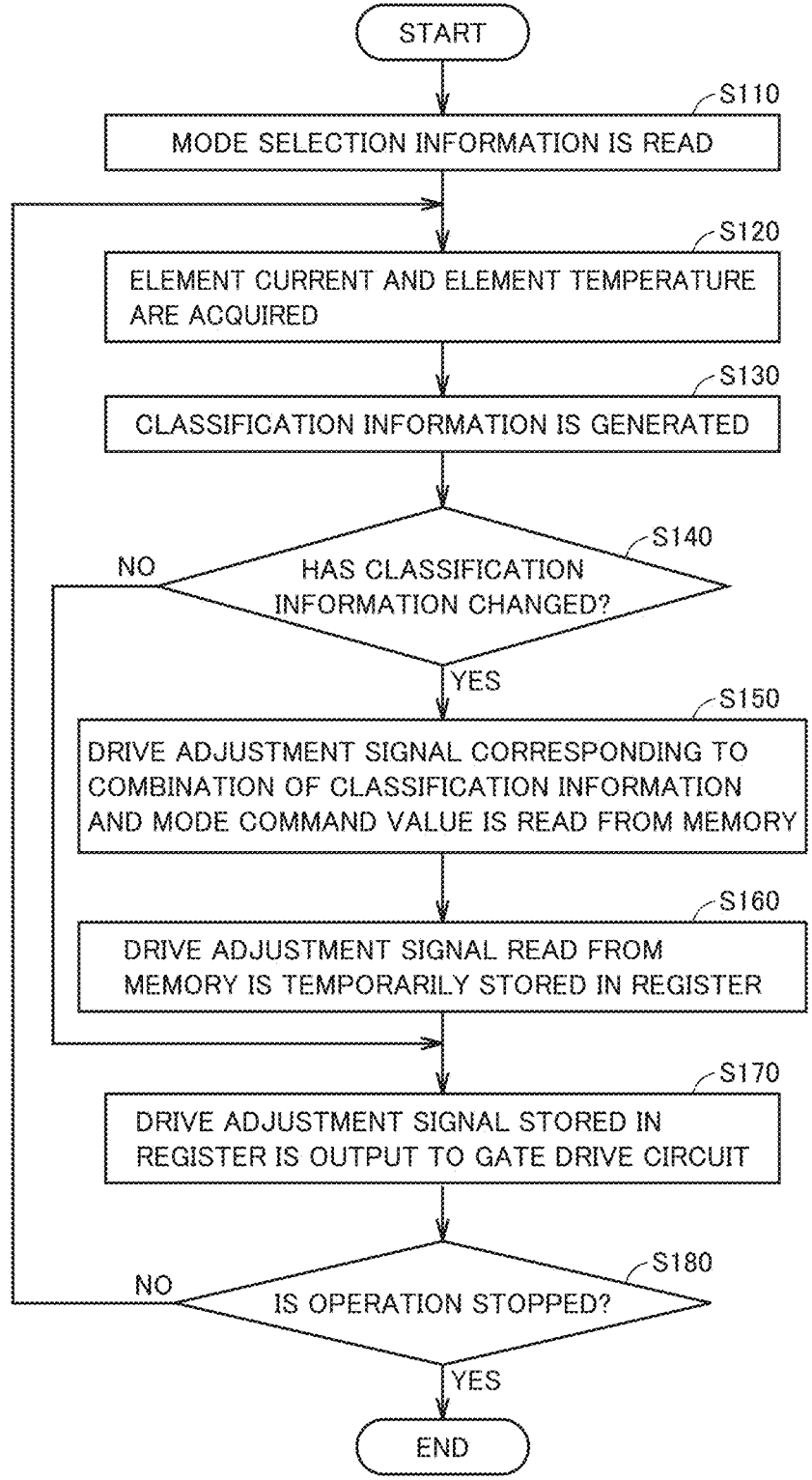
FIG. 7 is a flowchart illustrating a control process for switching speed control of the power semiconductor element according to the first embodiment.

The control process for switching speed control of the power semiconductor element according to the first embodiment will now be described using the flowchart in FIG. 7. FIG. 7 illustrates a series of control processing during operation of power conversion system 100, that is, during operation of power semiconductor element Q. For example, the process at each step described below can be implemented by software processing by a not-illustrated central processing unit (CPU) or the like executing a predetermined program. Alternatively, the process at each step may be implemented by hardware processing such as a dedicated electronic circuit or a combination of software processing and hardware processing.

Referring to FIG. 7, upon operation start of power conversion system 100, when the operation of power semiconductor element Q is started, at step (hereinafter simply referred to as "S") 100, drive control device 10A reads a mode selection by the user based on external input INext2. Then, at S110, mode command value MD described above is generated. Mode command value MD corresponds to an example of "second information". The process at S110 is implemented by selector circuit 27. For external input INext2, the preceding input value may be held in the inside of drive control device 10A until a different value is input.

Drive control device 10A repeatedly performs the process at S120 to S180 in synchronization with clock signal CLK until the operation of power conversion system 100 is stopped, that is, during operation of power semiconductor element Q (if the determination at S180 is NO).

At S120, drive control device 10A acquires element current Iq and element temperature Tq in each clock cycle. As described above, element current Iq and element temperature Tq can be determined based on the measurement values by current meter 30 and temperature meter 31. At S130, element current Iq and element temperature Tq are classified according to FIG. 4, whereby classification information of element temperature Tq (for example, information indicating any one of 1 to 3) and classification information of element current Iq (for example, information indicating any one of A to C) at present are generated. The process at S120 and S130 corresponds to the functions of current detector 28 and temperature detector 29 in FIG. 2. The classification information generated at S130 corresponds to an example of "first information".

At S140, drive control device 10A determines whether the classification information generated at S130 has changed from that in the previous clock cycle. At the operation start of power semiconductor element Q, the determination is YES at S140 initially processed.

If the determination is YES at S140, at S150, drive control device 10A reads one of multiple pieces of drive adjustment signal data held in memory 25, in accordance with a combination of the classification information generated at S130 and mode command value MD. Then, a set of drive adjustment signals Sp1 to Spn, Sn1 to Snn is read from memory 25. At S160, the read drive adjustment signals Sp1 to Spn, Sn1 to Snn are temporarily stored in register 24. On the other hand, if the determination is NO at S140, S150 and S160 are skipped and the content stored in register 24 is maintained.

At S170, drive control device 10A outputs drive adjustment signals Sp1 to Spn, Sn1 to Snn stored in register 24 in each clock cycle to gate drive circuit 20. Gate drive circuit 20 performs turn-on operation of power semiconductor element Q with the charge driving capability in accordance with drive adjustment signals Sp1 to Spn and performs turn-off operation of power semiconductor element Q with the discharge driving capability in accordance with drive adjustment signals Sn1 to Snn.

Thus, the switching speed can be adjusted in accordance with the operating state (temperature and current) of power semiconductor element Q, based on the switching speed mode selection (high speed/intermediate speed/low speed) by the user in each cycle of clock signal CLK. For example, the cycle period of clock signal CLK is set to the same as the switching cycle period of power semiconductor element Q or an integer multiple thereof.

Figure 8:
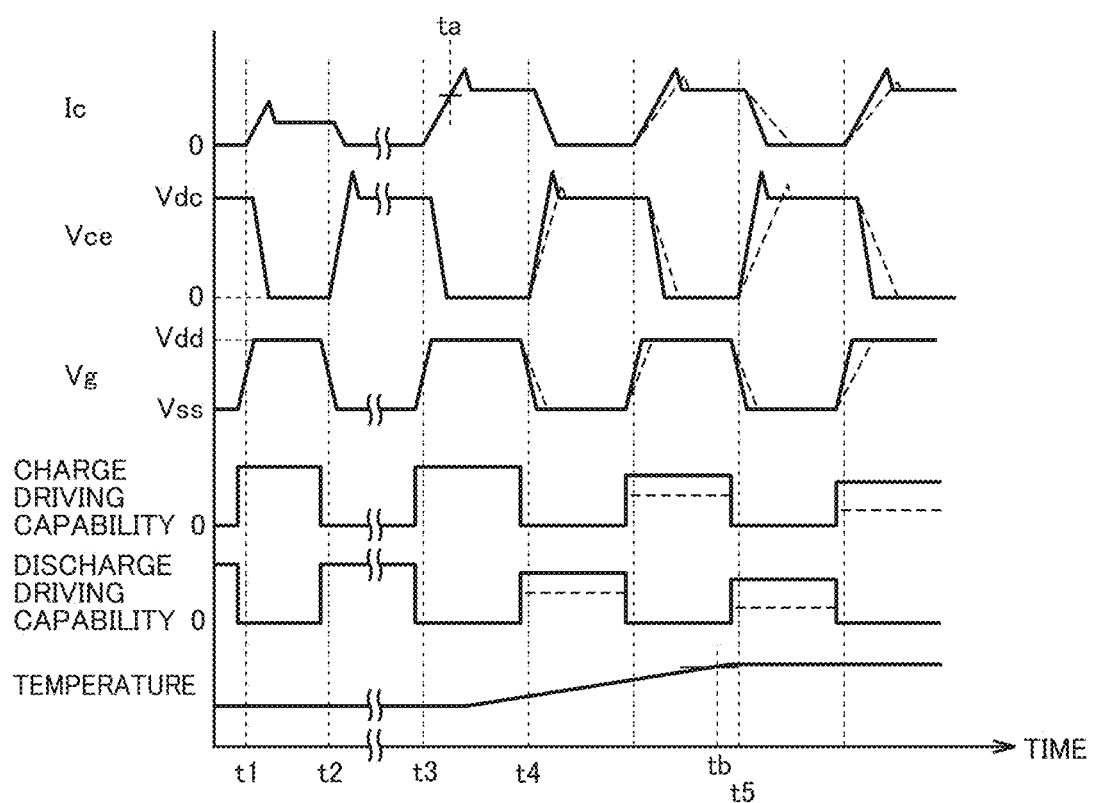
FIG. 8 is a waveform diagram for explaining an operation example of switching speed control of the power semiconductor element according to the first embodiment.

FIG. 8 illustrates a waveform diagram for explaining an operation example of switching speed control of the power semiconductor element according to the first embodiment.

Referring to FIG. 8, with respect to the time axis on the horizontal axis, the vertical axis indicates changes in main current (collector current Ic) of power semiconductor element Q, collector-emitter voltage Vce, gate voltage Vg (FIG. 2), charge driving capability, discharge driving capability, and element temperature Tq.

The charge driving capability is a parameter value indicating the magnitude of gate charge current and the magnitude of charge rate, and, for example, may be a value indicating the number of turned-on PMOS transistors MP1 to MPn in gate drive circuit 20. Similarly, the discharge driving capability is a parameter value indicating the magnitude of gate discharge current and the magnitude of discharge rate, and, for example, may be a value indicating the number of turned-on NMOS transistors MN1 to MNn in gate drive circuit 20.

In the operation example in FIG. 8, it is assumed that the user designates the high speed mode (MD1) as the switching speed mode selection. As described above, the high speed mode (MD1) is selected in the application in which the parasitic inductance value in the main circuit of the power conversion system is small and a margin for surge can be ensured. In the following, the operation example with the high speed mode being selected is illustrated by a solid line.

Times t1 and t2 correspond to the timings of turn-on operation and turn-off operation in a period immediately after the operation start of power semiconductor element Q upon start of power conversion system 100. At this stage, since the element current is small (classification A) and the temperature is low (classification 1), both the switching loss and the surge are not so large. Thus, in operating region A1, drive adjustment signals Sp1 to Spn, Sn1 to Snn of drive adjustment signal data DA1 (M1) in FIG. 5 are set such that the charge driving capability and the discharge driving capability are set to be high. As a result, at times t1, t2, power semiconductor element Q is turned on and turned off with the switching speed set to a relatively high speed.

After time t3, turn-on operation and turn-off operation are illustrated in a state in which the element current and the element temperature are increased as the time has passed since the operation start of power semiconductor elements Q.

At time ta, with increase of main current Ic, element current Iq changes from classification A (small current) to classification B (intermediate current). Thus, in the switching cycle after time t4, because of change in operating state of power semiconductor element Q, drive adjustment signals Sp1 to Spn, Sn1 to Snn of drive adjustment signal data DB1(MD1) in operating region B1 are used. Thus, the discharge driving capability in turn-off operation becomes lower than at time t2. Similarly, the charge driving capability in turn-off operation becomes lower than at time t1. Thus, the switching speed of power semiconductor element Q becomes slightly lower than that in the period of times t1 to t2.

In FIG. 8, a case where the switching speed mode selecting function is not provided is assumed as a comparative example. In the comparative example, in order to avoid element destruction due to surge and adverse effects on the surroundings due to electromagnetic noise, adjustment is performed such that the switching speed is decreased to some extent in response to increase in current and temperature. The operation according to the comparative example is illustrated by a dotted line in FIG. 8.

In the comparative example, in response to the change in operating region at time ta, the amount of decrease in discharge driving capability in turn-off operation and the amount of decrease in charge driving capability in turn-on operation are set to be larger than in the high speed mode in the present embodiment. Thus, the switching speed of power semiconductor element Q is lower than that of the operation example according to the present embodiment. Such adjustment is effective in preventing destruction of power semiconductor element Q by surge suppression, while the disadvantage of increase of switching loss in addition to increase of switching loss due to increasing main current may be noticeable in the application in which a margin for surge can be ensured as described above.

At time tb, with temperature increase of power semiconductor element Q due to increase in current conduction time, element temperature Tq changes from classification 1 (low temperature) to classification 2 (intermediate temperature). The temperature range of classification 2 can be set based on a temperature range that can be normally maintained by the effect of a cooling mechanism such as a heat sink provided for power semiconductor element Q when the power semiconductor element Q operates continuously within the rating.

Thus, in the switching cycle after time t5, with change in operating state of power semiconductor element Q, drive adjustment signals Sp1 to Spn, Sn1 to Snn of drive adjustment signal data DB2(MD1) in operating region B2 are used. Thus, the discharge driving capability in turn-off operation and the charge driving capability in turn-on operation are further decreased. Thus, the switching speed of power semiconductor element Q is further decreased, compared with the operation in operating region B1.

In the comparative example, the amounts of decrease in charge driving capability and in discharge driving capability corresponding to change (temperature increase) in operating state at time tb are set to be larger than in the high speed mode in the present embodiment. Thus, it is understood that the switching speed of power semiconductor element Q is further decreased compared with the control according to the present embodiment.

In the application in which the high speed mode can be selected, therefore, when the switching speed control according to the comparative example is performed, the disadvantage of increase of switching loss may be noticeable in addition to increase in switching loss due to temperature increase.

To put it another way, the present embodiment can provide a configuration corresponding to the comparative example in which the switching speed control in favor of surge suppression is set in the low speed mode (MD3), and another mode with a high switching speed can be selected by the user using external input INext2. As a result, in the application in which the parasitic inductance value is small and thus a surge margin can be ensured or the application in which a snubber circuit for surge absorption is arranged, the user can select the high speed mode (MD1) thereby reducing switching loss.

With this configuration, the power conversion efficiency can be improved and element temperature increase can be suppressed. As a result, the operating range of power semiconductor element Q (IGBT) is widened, and a wide variety of applications can be expected to be handled with power semiconductor element Q with single specifications. On the other hand, in the application with a small surge margin, the user can select the low speed mode (MD1) or the intermediate speed mode (MD2) using external input INext2.

In this way, the drive control device according to the present embodiment can provide the function of adjusting the switching speed matched with the situation of the application (for example, surge margin) on the user side, in addition to the function of adjusting the switching speed in accordance with the operating state of power semiconductor element Q (for example, current and temperature). In particular, the switching speed can be adjusted by a mode selection command using external input INext2 without requiring direct rewrite of the drive adjustment signal, so that the trade-off characteristic between switching loss and surge of the power semiconductor element can be easily adjusted on the user side.

Furthermore, the control configuration is employed in which drive adjustment signals Sp1 to Spn, Sn1 to Snn of gate drive circuit 20 are adjusted in accordance with change in operating region (FIG. 4) of power semiconductor element Q, based on the measurement values of element temperature Tq and element current Iq. As a result, the applications with different current ranges and temperature ranges in which power semiconductor element Q is used can be handled by a common configuration without changing the configuration of current detector 28, temperature detector 29, and gate drive circuit 20.

Since gate drive circuit 20 can have the gate charge rate and discharge rate adjusted by on/off of PMOS transistors and NMOS transistors connected in parallel as in the configuration example in FIG. 3, a lower impedance can be achieved at node Ng where gate voltage Vg is produced. As a result, the discharge rate can be adjusted without providing a power supply for negative voltage.

Second Embodiment

In the first embodiment, the switching speed mode selection is fixed during operation of the power semiconductor element. In a second embodiment, a control configuration in which the mode selection is automatically switched in accordance with element current Iq and element temperature Tq, that is, the operating state of the power semiconductor element will be described.

Figure 9:
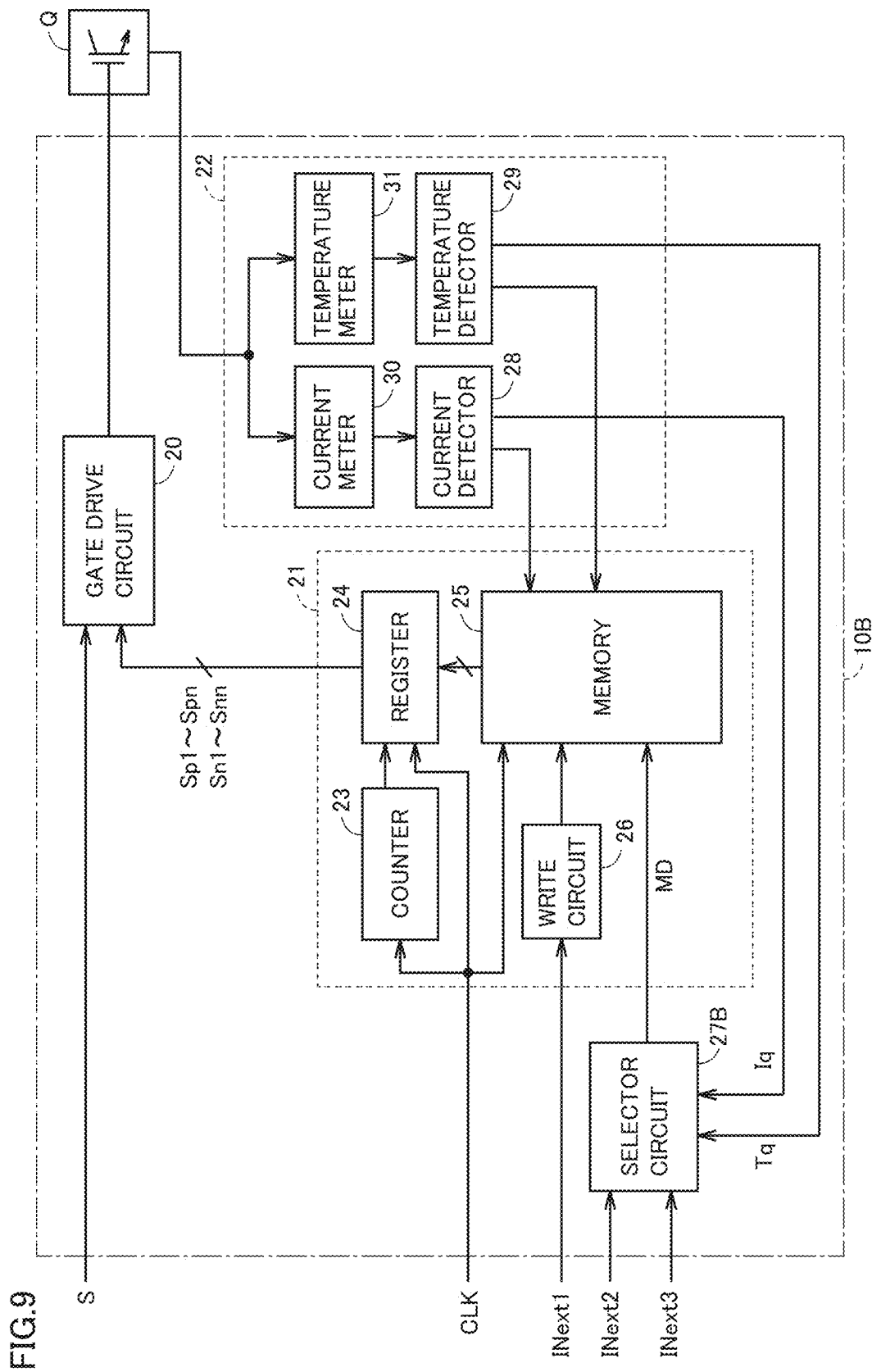
FIG. 9 is a block diagram illustrating a configuration example of a drive control device according to a second embodiment.

FIG. 9 is a block diagram illustrating a configuration example of a drive control device according to the second embodiment.

Referring to FIG. 9, a drive control device 10B according to the second embodiment differs from drive control device 10A illustrated in FIG. 2 in that it includes a selector circuit 27B instead of selector circuit 27.

An external input INext3 is further input to selector circuit 27B, in addition to external input INext2 similar to that of the first embodiment. Selector circuit 27B designates a mode selected by external input INext2, using mode command value MD, at the operation start of the power semiconductor element. In other words, in the second embodiment, the mode selected by external input INext2 means an initial value of mode selection.

External input INext3 includes information for switching the mode selection in accordance with the operating state (for example, element temperature Tq and element current Iq) of power semiconductor element Q. As an example, external input INext3 includes a temperature threshold Tth and a current threshold Ith to switch the mode selection, information to designate a mode selected at Tq>Tth (over high temperature state), and information to designate a mode selected at Iq>Ith (overcurrent state).

Here, it is assumed that when at least one of the overcurrent state and the over high temperature state is detected, selector circuit 27B generates mode command value MD such that the low speed mode (MD3) is selected in accordance with the information. On the other hand, when Tq≤Tth and Iq≤Ith, selector circuit 27B generates mode command value MD such that the high speed mode (MD1) is selected in accordance with external input INext2.

Current threshold Ith for detecting the overcurrent state may be common to the boundary value of classification B (intermediate current) and classification C (large current) in FIG. 4. Similarly, temperature threshold Tth for detecting the overcurrent state may be common to the boundary value of classification 2 (intermediate temperature) and classification 3 (high temperature) in FIG. 4.

The configuration of drive control device 10B according to the second embodiment is similar to drive control device 10A according to the first embodiment except for the setting of mode command value MD and therefore will not be further elaborated.

Figure 10:
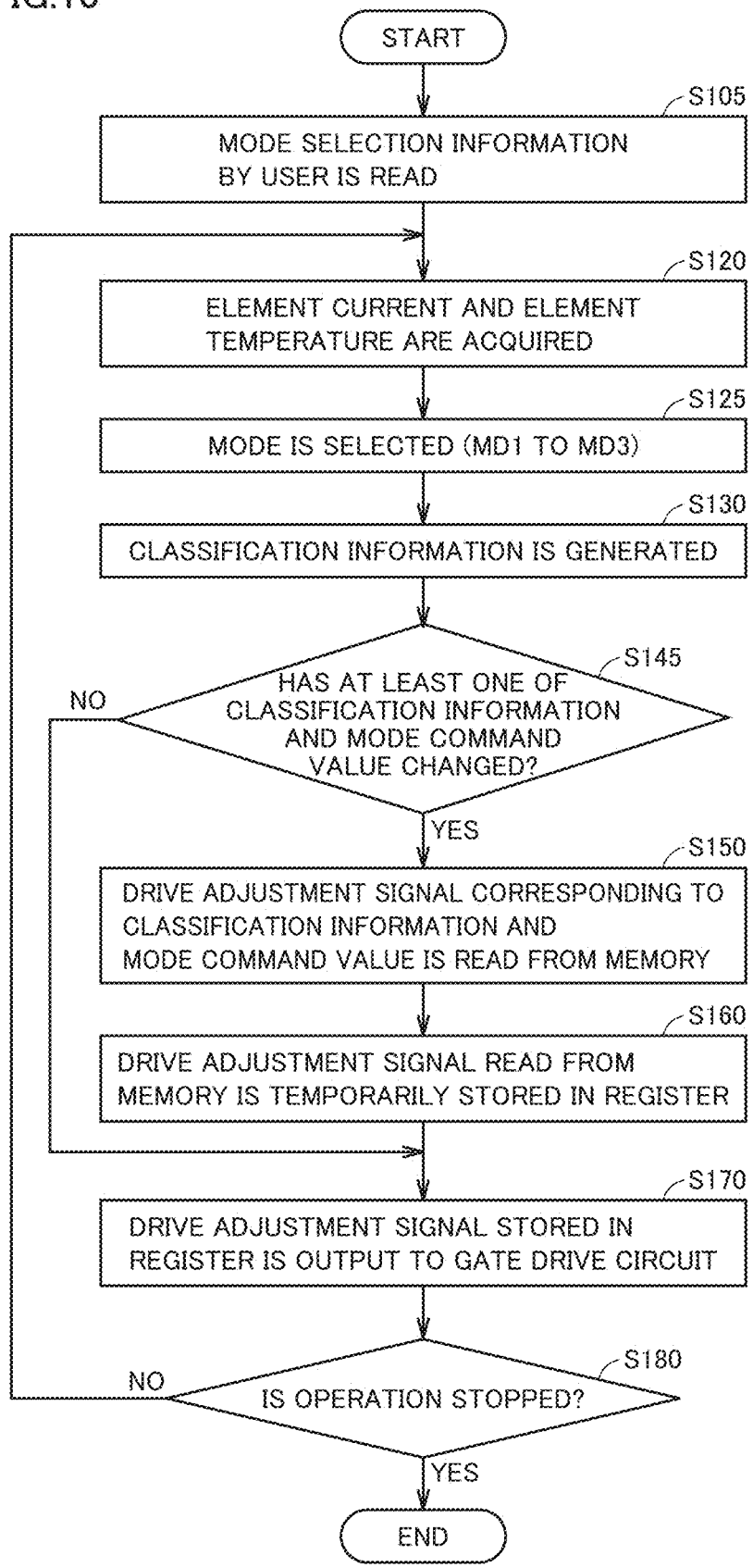
FIG. 10 is a flowchart illustrating a control process for switching speed control of the power semiconductor element according to the second embodiment.

FIG. 10 is a flowchart illustrating a control process for switching speed control of the power semiconductor element according to the second embodiment. FIG. 10, similar to FIG. 7, illustrates a series of control processing during operation of power conversion system 100, and the process at each step can be implemented by at least one of the software processing or the hardware processing described above.

Referring to FIG. 10, at S105, when the operation of power semiconductor element Q is started, drive control device 10B reads mode selection information by the user using external inputs INext2, INext3. As described above, the mode selection information can include an initial value of mode selection, current threshold Ith and temperature threshold Tth for mode switching, and information to designate the mode selection after switching.

Drive control device 10B repeatedly performs the process at S120 to S180 in synchronization with clock signal CLK until the operation of power semiconductor element Q is stopped (if the determination at S180 is NO), that is, during operation of power semiconductor element Q, in the same manner as in FIG. 7.

Drive control device 10B acquires element temperature Tq and element current Iq in each clock cycle at S120 similar to that in FIG. 7, and then selects one of modes MD1 to MD3 based on the acquired element temperature Tq and element current Iq, and the mode selection information (S105) at S125. Thus, mode command value MD is output from selector circuit 27B to memory 25.

For example, at S125, the high speed mode (MD1) is selected when Tq<Tth and Iq<Ith as described above, whereas the low speed mode (MD3) is selected when at least one of Tq>Tth and Iq>Ith is satisfied.

At S130 similar to that in FIG. 7, drive control device 10B generates classification information of element temperature Tq (for example, information indicating any one of 1 to 3) and classification information of element current Iq (for example, information indicating any one of A to C), from the acquired element temperature Tq and element current Iq (S120).

At S145, drive control device 10B determines whether at least one of the mode (mode command value MD) selected at S125 and the classification information generated at S140 has changed from that in the previous clock cycle. At the operation start of power semiconductor element Q, the determination is YES at S145 in the same manner as in S140 (FIG. 7).

If the determination is YES at S145, at S150 and S160 similar to those in FIG. 7, drive control device 10B reads a set of drive adjustment signals Sp1 to Spn, Sn1 to Snn from memory 25 and stores the same temporarily in register 24, in accordance with a combination of the mode selected at S125 (one of MD1 to MD3) and the classification information generated at S130. On the other hand, if the determination is NO at S145, S150 and S160 are skipped and the content stored in register 24 is maintained. At S170 similar to that in FIG. 7, drive adjustment signals Sp1 to Spn, Sn1 to Sim stored in register 24 in each clock cycle are output to gate drive circuit 20.

Thus, gate drive circuit 20 performs turn-on operation of power semiconductor element Q with the charge driving capability in accordance with drive adjustment signals Sp1 to Spn and performs turn-off operation of power semiconductor element Q with the discharge driving capability in accordance with drive adjustment signals Sn1 to Snn.

In this way, in drive control device 10B according to the second embodiment, the mode selection can be switched during operation of power semiconductor element Q, in accordance with the mode selection information read at S105.

Figure 11:
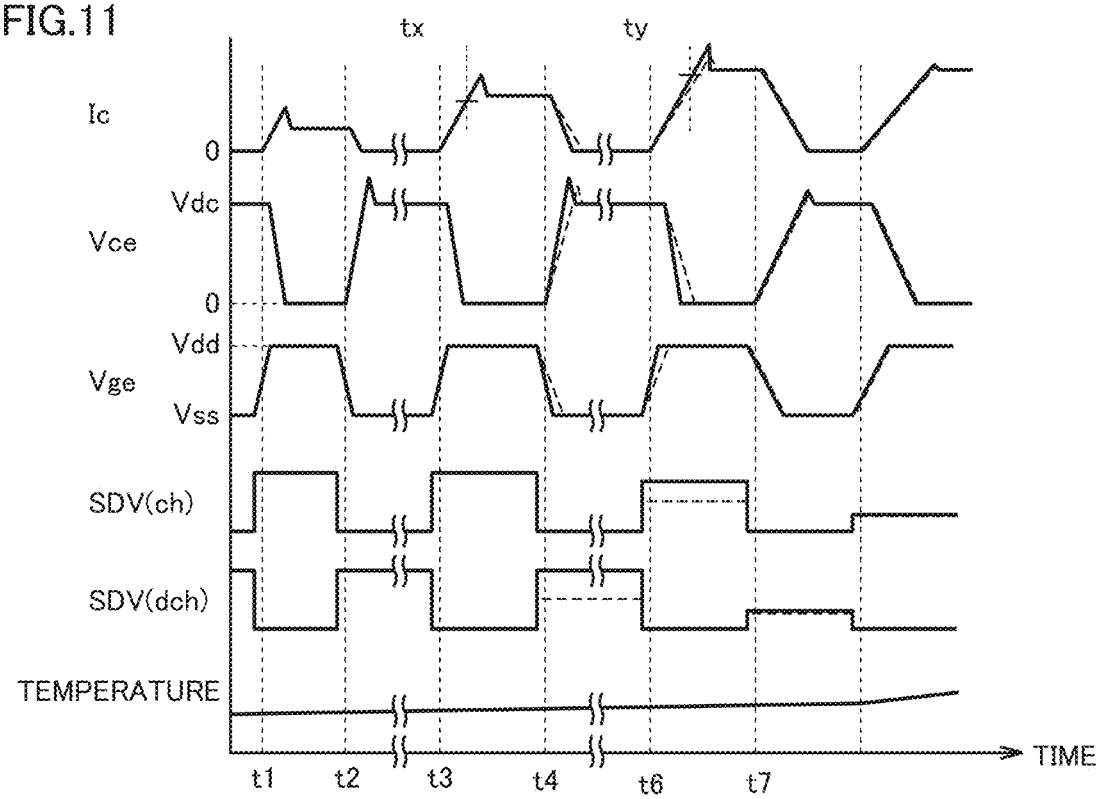
FIG. 11 is a waveform diagram for explaining an operation example of switching speed control of the power semiconductor element according to the second embodiment.

FIG. 11 illustrates a waveform diagram for explaining an operation example of switching speed control of the power semiconductor element according to the second embodiment. The horizontal axis and the vertical axis in FIG. 11 are similar to those in FIG. 8.

Referring to FIG. 11, the switching operation of power semiconductor element Q in a period of times t1 to t2 is similar to that in FIG. 8, and at time tx, the operating state of power semiconductor element Q changes, in the same manner as at time to in FIG. 8. That is, with increase of main current Ic, element current Iq changes from classification A (small current) to classification B (intermediate current). Thus, in the switching cycle after time t4, drive adjustment signals Sp1 to Spn, Sn1 to Snn of drive adjustment signal data DB1(MD1) in operating region B1 in the high speed mode is used.

Subsequently, the operation of power semiconductor element Q is continued, and at time t6, the operating region of power semiconductor element Q is classification 2 (intermediate temperature) for element temperature Tq and classification B (intermediate current) for element current Iq. At this moment, while switching loss increases with increase in current and temperature, the high speed mode (MD1) is maintained and the switching loss is suppressed.

Figure 12:
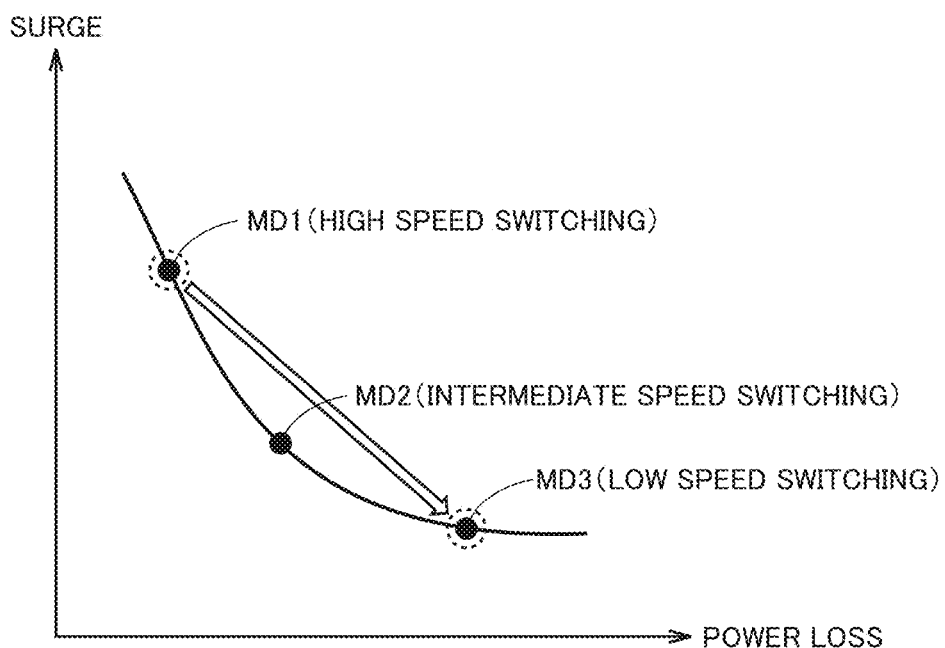
FIG. 12 is a conceptual diagram illustrating mode change in the operation example of switching speed control illustrated in FIG. 11.

At time ty, element current Iq exceeds current threshold Ith, causing the overcurrent state. In response, the mode selection is switched from the high speed mode (MD1) to the low speed mode (MD3) as illustrated FIG. 12, during operation of power semiconductor element Q. Here, it is assumed that with Iq>Ith, the classification of element current Iq also changes from intermediate current (classification B) to large current (classification C).

Referring to FIG. 11 again, in the switching cycles after time t7, drive adjustment signals Sp1 to Spn, Sn1 to Snn of drive adjustment signal data DC2(MD3) in the low speed mode (MD3) in operating region C2 with large current and intermediate temperature are used.

Thus, the discharge driving capability at the time of turn-off and the charge driving capability at the time of turn-on are decreased to those equivalent to the comparative example illustrated in FIG. 8. As a result, the turn-on operation and the turn-off operation of power semiconductor element Q can be controlled to a moderate speed in favor of safe operation so that occurrence of surge exceeding a permissible value under large current is prevented. Subsequently, when element current Iq decreases out of the overcurrent state, the high speed mode (MD1) is selected again to reduce the switching loss.

In this way, in the second embodiment, during operation of power semiconductor element Q, the switching speed matched with the application is selected to reduce the switching loss in a normal use state, whereas when the overcurrent state or the over high temperature state temporarily occurs due to the influence of disturbance or the like, the switching speed can be adjusted automatically in favor of safe operation. As a result, in addition to the effect described in the first embodiment, the effect of implementing robust switching operation is further achieved to eliminate the influence of disturbance on power semiconductor element Q.

In particular, the switching speed mode selection automatically corresponding to the overcurrent state or the over high temperature state is automatically switched based on the mode selection information input before the operation start of power semiconductor element Q, without requiring the subsequent use's action. Even with the configuration according to the second embodiment, therefore, adjustment on the user side is easy.

In the second embodiment, the mode to be selected may be preset for each operating region according to a combination of the classification of element current Iq and the classification of element temperature Tq illustrated in FIG. 4, instead of the settings of current threshold Ith and temperature threshold Tth described above. In this case, information on which of modes MD1 to MD3 to select for each operating region is input by the user as the mode selection information, using external input INext3 to selector circuit 27B (S105). Further, selector circuit 27B can receive the classification information of element current and element temperature by current detector 28 and temperature detector 29, instead of element current Iq and element temperature Tq, to generate mode command value MD (S125).

In the first and second embodiments, the trade-off characteristic between switching loss and surge has been explained. However, the switching speed also influences electromagnetic noise caused by switching of power semiconductor element Q. Like surge, electromagnetic noise tends to increase as the switching speed increases. It is therefore preferable to select the switching speed mode, considering the permitted amount of electromagnetic noise in addition to surge. In the present embodiment, since the switching speed can be adjusted by selecting a mode, the user can adjust the trade-off characteristic relatively easily even when electromagnetic noise is added as a factor to be considered.

In each of the first and second embodiments, a circuit configuration different from the configuration example in FIG. 4 may be applied to gate drive circuit 20 (FIG. 2).

Figure 13:
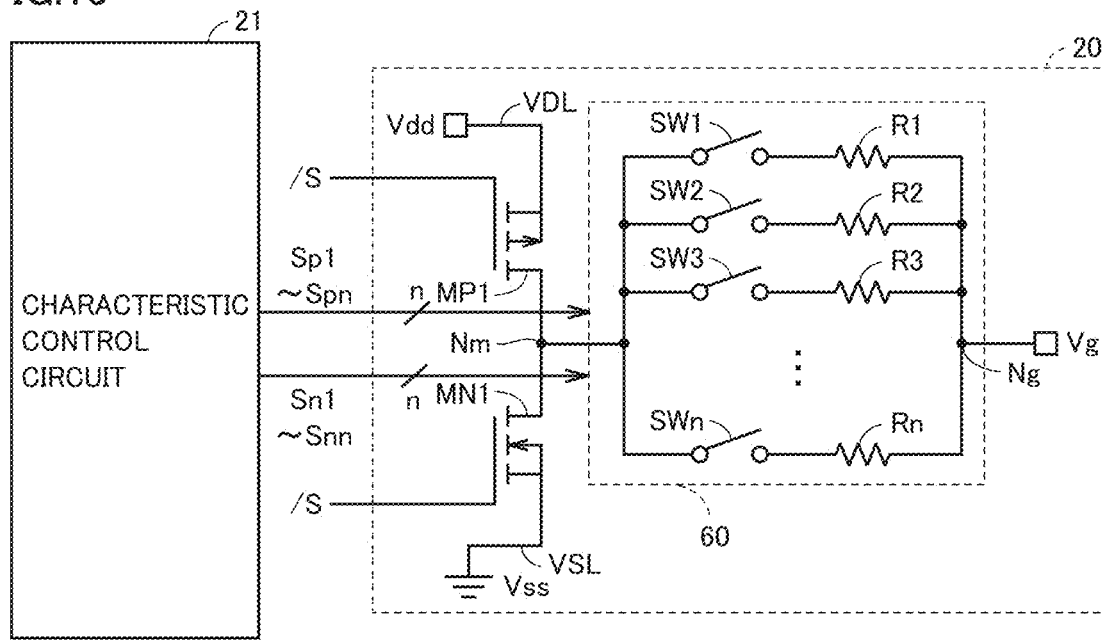
FIG. 13 is a circuit diagram illustrating a first modification to the configuration of the gate drive circuit illustrated in FIG. 2.

FIG. 13 is a circuit diagram illustrating a first modification to the configuration of gate drive circuit 20.

Referring to FIG. 13, in the first modification, gate drive circuit 20 includes a PMOS transistor MP1, an NMOS transistor MN1, and a gate resistance variable circuit 60.

PMOS transistor MP1 is connected between first power supply line VDL and a node Nm. NMOS transistor MN1 is connected between node Nm and second power supply line VSL. An inversion signal (/S) of control signal S is input to the gates of PMOS transistor MP1 and NMOS transistor MN1. /S is set to "0 (logic low level)" in ON period of power semiconductor element Q and set to "1 (logic high level)" in OFF period.

Gate resistance variable circuit 60 is connected between node Nm and node Ng to the gate of power semiconductor element Q. Gate resistance variable circuit 60 includes switches SW1 to SWn and resistance elements R1 to Rn. Switches SW1 to SWn are connected between node Nm and node Ng in series with resistance elements R1 to Rn, respectively. Therefore, in gate resistance variable circuit 60 as a whole, n sets of switches SW and resistance element R connected in series are connected in parallel between node Nm and node Ng.

When inversion signal IS is "0" (in ON period of power semiconductor element Q), switches SW1 to SWn are turned on/off in accordance with drive adjustment signals Sp1 to Spn, respectively. On the other hand, when inversion signal IS is "1" (in OFF period of power semiconductor element Q), switches SW1 to SWn are turned on/off in accordance with drive adjustment signals Sn1 to Snn, respectively.

At the time of turn-on of power semiconductor element Q, in response to inversion signal /S="0", PMOS transistor MP1 is turned on and NMOS transistor MN1 is turned off, whereby the gate of power semiconductor element Q is charged through node Ng.

The electrical resistance (called gate resistance) on the charge path at the time of gate charge changes with the number of resistance elements connected between node Nm to node Ng, in accordance with on/off of switches SW1 to SWn. Specifically, as the number of turned-on switches SW1 to SWn increases, the number of resistance elements connected in parallel increases, and the gate resistance decreases and thus the charge rate increases.

In other words, the gate charge rate can be adjusted by adjusting the gate resistance at the time of charge by drive adjustment signals Sp1 to Spn for controlling on/off of switches SW1 to SWn.

On the other hand, at the time of turn-off of power semiconductor element Q, in response to inversion signal /S="1", NMOS transistor MN1 is turned on and PMOS transistor MP1 is turned off, whereby the gate of power semiconductor element Q is discharged through node Ng.

The electrical resistance (called gate resistance) on the discharge path at the time of gate discharge changes with the number of resistance elements connected between node Nm to node Ng, in accordance with on/off of switches SW1 to SWn, in the same manner as at the time of gate charge. Specifically, as the number of turned-on switches SW1 to SWn increases, the gate resistance decreases and thus the discharge rate increases.

In other words, the gate discharge rate can be adjusted by adjusting the gate resistance at the time of discharge by drive adjustment signals Sn2 to Snn for controlling on/off of switches SW1 to SWn.

In this way, even with gate drive circuit 20 having the circuit configuration illustrated in FIG. 13, the gate charge/discharge rate of power semiconductor element Q can be adjusted by drive adjustment signals Sp1 to Spn, Sn1 to Snn from characteristic control circuit 21, in the same manner as the circuit configuration illustrated in FIG. 4. In the circuit configuration in FIG. 13, while the circuit design can be easy, the circuit scale tends to increase for fine tuning. In addition, a negative power source may be required for discharge, because the impedance at node Ng (gate) is higher than that in the circuit configuration in FIG. 4.

Figure 14:
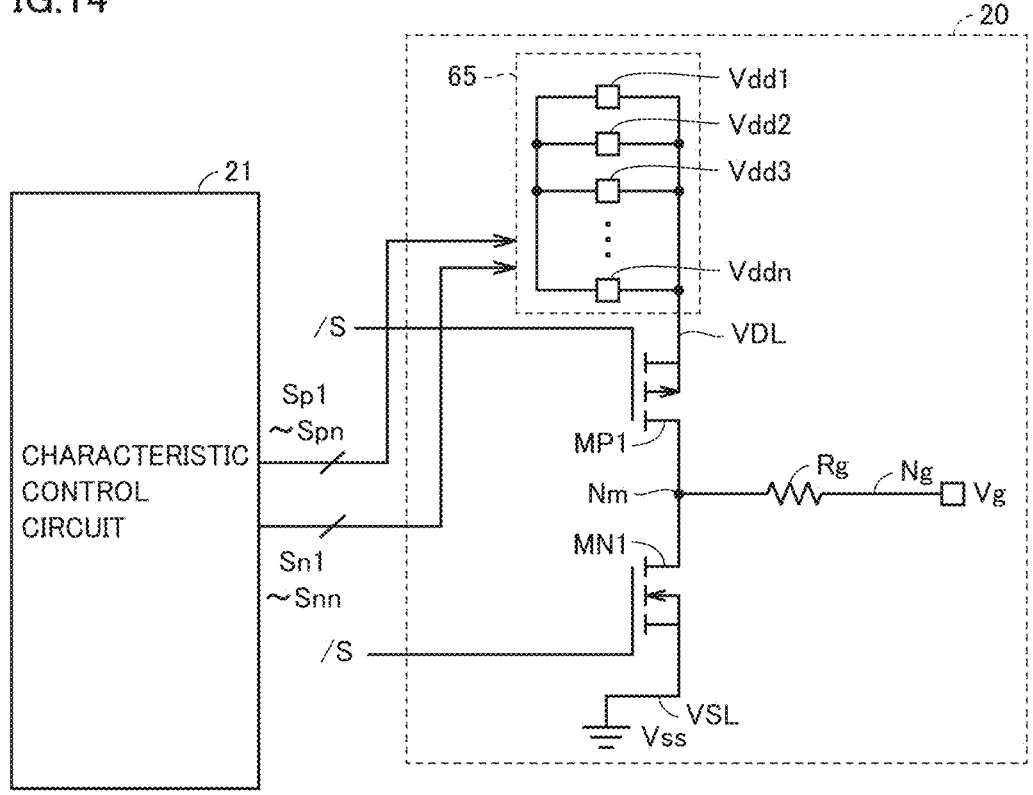
FIG. 14 is a circuit diagram illustrating a second modification to the configuration of the gate drive circuit illustrated in FIG. 2.

FIG. 14 is a circuit diagram illustrating a second modification to the configuration of gate drive circuit 20.

Referring to FIG. 14, in the second modification, gate drive circuit 20 includes a PMOS transistor MP1, an NMOS transistor MN1, and a power supply voltage variable circuit 65.

PMOS transistor MP1 and NMOS transistor MN1 are connected in series between first power supply line VDL and second power supply line VSL through node Nm, in the same manner as in the first modification in FIG. 13. An inversion signal (IS) of control signal S is input to the gates of PMOS transistor MP1 and NMOS transistor MN1, in the same manner as in FIG. 13. A single gate resistor Rg is connected between node Nm and node Ng.

Power supply voltage variable circuit 65 includes n power supplies Vdd1 to Vddn with different output voltages. When inversion signal /S is "0" (in ON period of power semiconductor element Q), power supply voltage variable circuit 65 connects one of power supplies Vdd1 to Vddn to first power supply line VDL, in accordance with drive adjustment signals Sp1 to Spn. On the other hand, when inversion signal /S is "1" (in OFF period of power semiconductor element Q), one of power supplies Vdd1 to Vddn is connected to first power supply line VDL in accordance with drive adjustment signals Sn1 to Snn.

When the power supply voltage supplied from first power supply line VDL changes, charge current and discharge current change. As the power supply voltage increases, the charge current and the discharge current increase, thereby enhancing the charge rate and the discharge rate.

Therefore, even with gate drive circuit 20 having the circuit configuration illustrated in FIG. 14, the gate charge/discharge rate of power semiconductor element Q can be adjusted by selecting power supplies Vdd1 to Vddn by drive adjustment signals Sp1 to Spn, Sn1 to Snn from characteristic control circuit 21.

Although the circuit configuration in FIG. 14 is a simple circuit configuration, it is difficult to ensure a wide range of power supply voltage and therefore the range of adjusting the charge/discharge rate tends to be narrow. In particular, in order to widen the range of adjusting the discharge rate, it may be necessary to add a configuration to enable selection of a negative voltage on the second power supply line VSL side.

In this way, it is understood that gate drive circuit 20 in the first and second embodiments can employ any circuit configuration as long as the charge/discharge rate can be adjusted by drive adjustment signals Sp1 to Spn, Sn1 to Snn.

Third Embodiment

Figure 15:
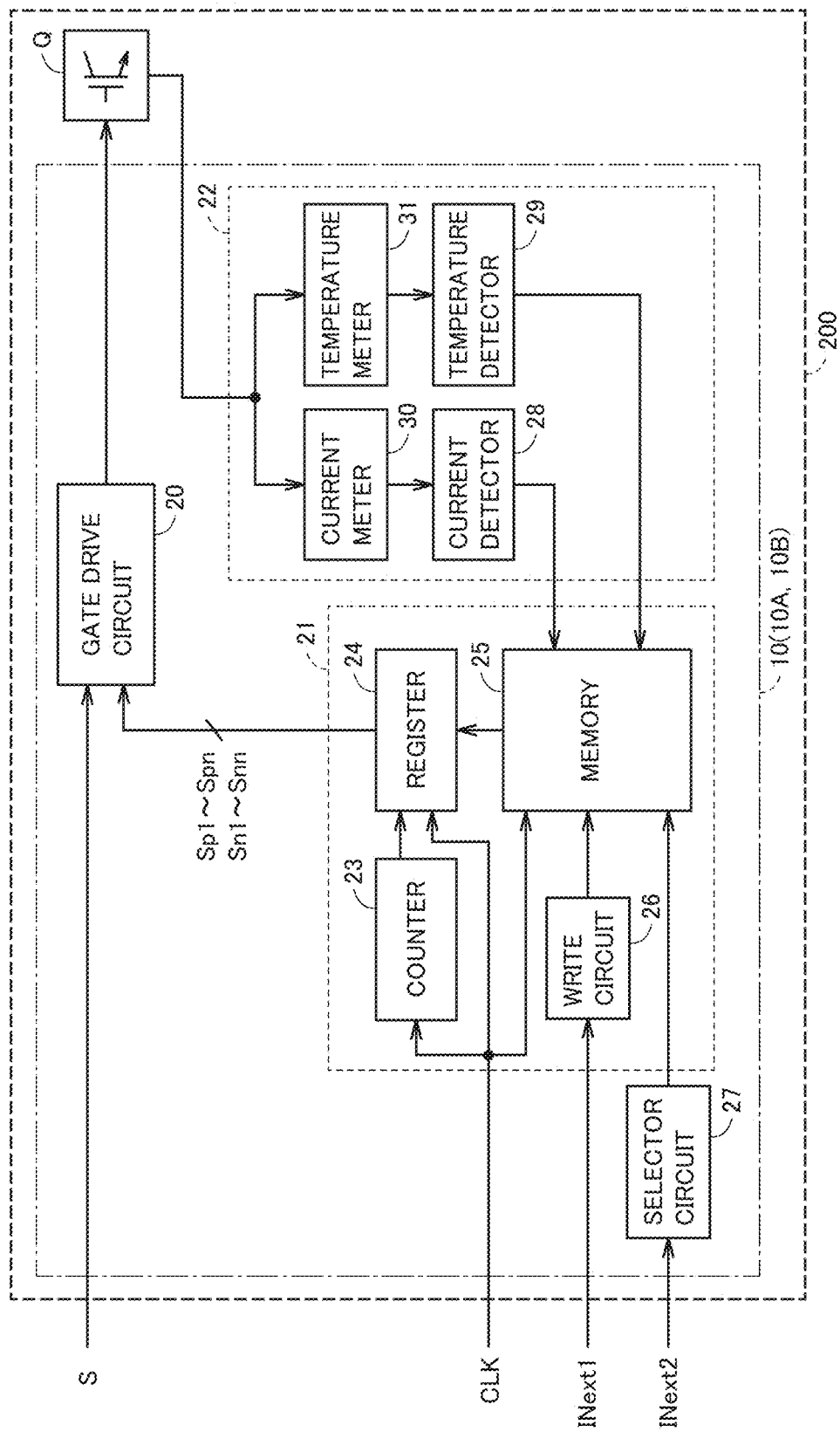
FIG. 15 is a block diagram illustrating a configuration example of a power module according to a third embodiment.

FIG. 15 is a block diagram illustrating a configuration example of a power module according to a third embodiment.

Referring to FIG. 15, a power module 200 according to the third embodiment includes drive control device 10 and power semiconductor element Q of which switching is controlled by drive control device 10. Drive control device 10 collectively denotes drive control device 10A according to the first embodiment and drive control device 10B according to the second embodiment.

For example, power module 200 can be configured such that drive control device 10 and power semiconductor element Q are integrated with a power supply circuit, a control circuit, a cooling mechanism, and the like, not illustrated, in the same package with a sealing material.

The integrated power module can be expected to reduce the circuit scale of power conversion system 100 and facilitate adjustment input on the user side.

In the first to third embodiments, power semiconductor element Q on/off-controlled by the drive control device in the present embodiment may be any element that is turned on/off with charge/discharge of the control electrode, other than IGBT, such as a MOSFET or a high electron mobility transistor (HEMT). The power semiconductor element may be made of any material, such as silicon (Si), silicon carbide (SiC), or gallium nitride (GaN).

In the present embodiment, power semiconductor element Q is applied to three phase inverter 103. However, the application of the power semiconductor element on/off-controlled by the drive control device according to the present embodiment is not limited to a three phase inverter and may be a power converter having any circuit configuration.

Embodiments disclosed here should be understood as being illustrative rather than being limitative in all respects. The technical scope of the present disclosure is shown not in the foregoing description but in the claims, and it is intended that all modifications that come within the meaning and range of equivalence to the claims are embraced here.

REFERENCE SIGNS LIST 10, 10A, 10B drive control device, 20 gate drive circuit, 21 characteristic control circuit, 22 classification circuit, 23 counter, 24 register, 25 memory, 26 write circuit, 27, 27B selector circuit, 28 current detector, 29 temperature detector, 30 current meter, 31 temperature meter, 60 gate resistance variable circuit, 65 power supply voltage variable circuit, 100 power conversion system, 101 DC power source, 102 link capacitor, 103 three phase inverter, 104 AC motor, 200 power module, A1 to A3, B1 to B3, C1 to C3 operating region (power semiconductor element), CLK clock signal, INext1 to INext3 external input, Ic main current (collector current), Iq element current, Ith current threshold, MD mode command value, NL, PL power line, Nu, Nv, Nw AC node, Q, Qun, Qup, Qvn, Qvp, Qwn, Qwp power semiconductor element, Tq element temperature, Tth temperature threshold, VDL first power supply line, VSL second power supply line.

The invention claimed is:

1. A drive control device for a power semiconductor element switching-controlled, comprising:
a classification circuit to generate first information for classifying an operating state of the power semiconductor element into one of a plurality of predetermined operating regions each corresponding to at least three predetermined ranges of operating temperatures of the power semiconductor element and at least three predetermined ranges of operating currents of the power semiconductor element;
a characteristic control circuit to adjust a charge rate of a control electrode of the power semiconductor element in turn-on operation of the power semiconductor element and a discharge rate of the control electrode in turn-off operation of the power semiconductor element;
a selector circuit to generate second information for selecting one mode of a plurality of modes with different switching speeds of the power semiconductor element; and
a gate drive circuit to charge and discharge the control electrode respectively at the charge rate and the discharge rate variably set in accordance with a drive adjustment signal, which is set in accordance with the first information and the second information, from the characteristic control circuit, at a time of the turn-on operation and at a time of the turn-off operation.

2. The drive control device for a power semiconductor element according to claim 1, wherein the characteristic control circuit stores the drive adjustment signal for setting the charge rate and the discharge rate, in advance, for each of combinations of the operating regions and the modes, and outputs the drive adjustment signal in the combination of one operating region among the operating regions and one mode among the modes that is selected in accordance with the first information and the second information.

3. The drive control device for a power semiconductor element according to claim 1, wherein the selector circuit generates the second information so as to be fixed to a user command for selecting one mode among the modes, at operation start of the power semiconductor element, during operation of the power semiconductor element.

4. The drive control device for a power semiconductor element according to claim 1, wherein the selector circuit generates the second information so as to switch selection of one mode among the modes in accordance with the second information and the operating state at each time point, during operation of the power semiconductor element.

5. The drive control device for a power semiconductor element according to claim 1, further comprising:
- a current measurement circuit to measure main current of the power semiconductor element; and
- a temperature measurement circuit to measure temperature of the power semiconductor element,
- wherein the classification circuit generates the first information in accordance with a combination of a classification as to which of a plurality of predetermined current regions element current of the power semiconductor element belongs to and a classification as to which of a plurality of predetermined temperature regions element temperature of the power semiconductor element belongs to, based on measurement values of the current measurement circuit and the temperature measurement circuit.

6. The drive control device for a power semiconductor element according to claim 1, wherein
- the characteristic control circuit includes a memory to store a plurality of the drive adjustment signals corresponding to the modes, in association with each of the operating regions, and
- the drive control device further comprises an input circuit to overwrite the drive adjustment signals stored in the memory using a signal from outside of the drive control device.

7. A power module comprising:
- the drive control device according to claim 1; and
- the power semiconductor element to be turned on/off by the drive control device.

* * * * *